(12) United States Patent
Lee et al.

(10) Patent No.: US 10,985,752 B2
(45) Date of Patent: Apr. 20, 2021

(54) HYBRID DRIVE CIRCUIT

(71) Applicant: DELTA ELECTRONICS, INC., Taoyuan (TW)

(72) Inventors: Lei-Ming Lee, Taoyuan (TW); Xin-Hung Lin, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 16/713,997

(22) Filed: Dec. 13, 2019

(65) Prior Publication Data

US 2020/0389168 A1 Dec. 10, 2020

(30) Foreign Application Priority Data

Jun. 6, 2019 (CN) .......................... 201910491216.5

(51) Int. Cl.
  *H03K 17/687* (2006.01)
  *H03K 17/567* (2006.01)
  *H03K 17/60* (2006.01)

(52) U.S. Cl.
  CPC ........... *H03K 17/567* (2013.01); *H03K 17/60* (2013.01)

(58) Field of Classification Search
  CPC ............. H03K 17/063; H03K 17/0822; H03K 17/04123; H03K 17/04126; H03K 17/168; H03K 17/60; H03K 17/567; H03K 17/6877; H03K 17/725
  See application file for complete search history.

(56) References Cited

U.S. PATENT DOCUMENTS

| | | | |
|---|---|---|---|
| 10,110,219 B2 * | 10/2018 | Kakimoto | ............ H03K 17/567 |
| 2009/0296291 A1 | 12/2009 | Volke | |
| 2015/0028383 A1 | 1/2015 | Voss et al. | |
| 2016/0191021 A1 | 6/2016 | Zhao et al. | |
| 2018/0099574 A1 | 4/2018 | Zhou et al. | |
| 2018/0138905 A1 | 5/2018 | Kakimoto | |
| 2018/0316342 A1 | 11/2018 | Fu et al. | |
| 2018/0375508 A1 * | 12/2018 | Morisaki | ............ H03K 17/0822 |

FOREIGN PATENT DOCUMENTS

| | | |
|---|---|---|
| CN | 107947538 A | 4/2018 |
| CN | 109698608 A | 4/2019 |
| JP | 2016-225696 | 12/2016 |
| WO | WO 2016014907 A1 | 1/2016 |
| WO | WO 2017026367 | 2/2017 |

OTHER PUBLICATIONS

Search Report issued in corresponding European patent application No. EP19214202.4 dated Jul. 21, 2020.

* cited by examiner

*Primary Examiner* — Long Nguyen
(74) *Attorney, Agent, or Firm* — Muncy, Geissler, Olds & Lowe, P.C.

(57) ABSTRACT

A hybrid drive circuit (100, 100') drives a first characteristic transistor and a second characteristic transistor coupled in parallel to the first characteristic transistor according to an input signal (Sin). The hybrid drive circuit (100, 100') includes a first turn-on path (Pc1), a first turn-off path (Ps1), a second turn-on path (Pc2), and a second turn-off path (Ps2). The first turn-on path (Pc1) and the second turn-on path (Pc2) produce a first delay time to delay turning on the first characteristic transistor. The first turn-off path (Ps1) and the second turn-off path (Ps2) produce a second delay time to delay turning off the second characteristic transistor.

4 Claims, 10 Drawing Sheets

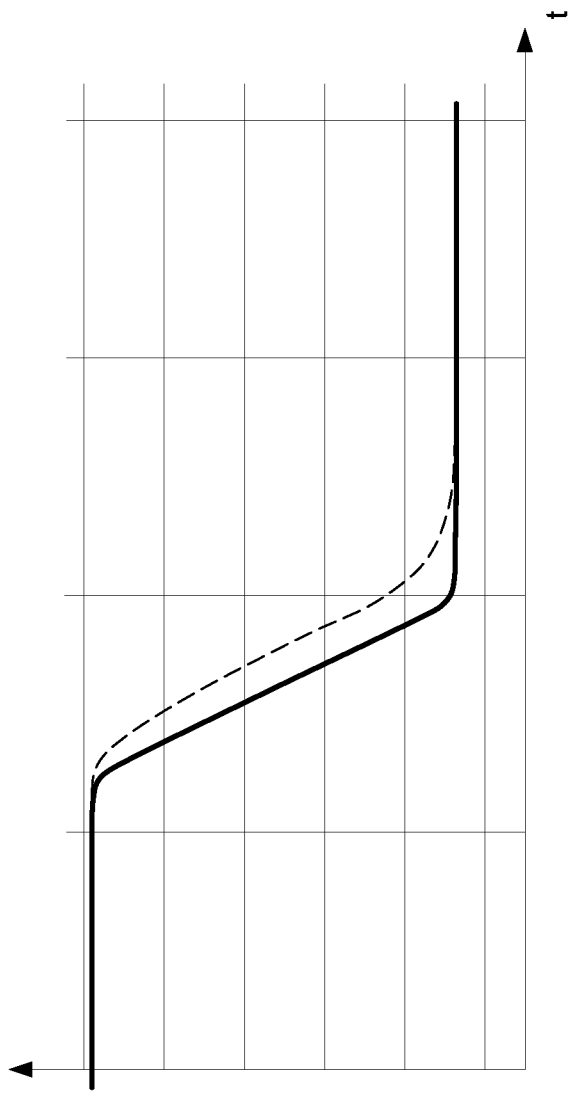

US 10,985,752 B2

HYBRID DRIVE CIRCUIT

BACKGROUND OF THE INVENTION

Technical Field

The present disclosure relates to a hybrid drive circuit, and more particularly to a hybrid drive circuit for driving transistors with different characteristics.

Description of Related Art

The statements in this section merely provide background information related to the present disclosure and do not necessarily constitute prior art.

In the field of power electronics, IGBT (insulated gate bipolar transistor) and MOSFET (metal-oxide-semiconductor field-effect transistor) are common power switching components. If the switching frequency is considered, the IGBT is generally suitable for a switching component below 20 kHz, and if the switching frequency is above 20 kHz, the MOSFET is usually used as the switching component.

The main reason for the switching frequency as selecting power switching components is the efficiency effect of the power switching components with different characteristics. In particular, the IGBT has lower conduction losses and higher switching losses. In the high-frequency switching, a higher switching loss consumes more power (the MOSFET is opposite to that), resulting in low efficiency. However, in the design of the switching circuit, only a single type of power switching component is selected. In order to reduce the circuit volume, a higher switching frequency has become a trend, but only a single type of power switching component cannot effectively reduce the power losses.

SUMMARY OF THE INVENTION

In order to solve the above-mentioned problems, a hybrid drive circuit is provided in the present disclosure. The hybrid drive circuit drives a first characteristic transistor and a second characteristic transistor coupled in parallel to the first characteristic transistor according to an input signal. The hybrid drive circuit includes a first branch and a second branch. The first branch includes a first turn-on path and a first turn-off path. The second branch includes a second turn-on path and a second turn-off path. The first turn-on path turns on the first characteristic transistor according to a rising edge of the input signal. The first turn-off path turns off the first characteristic transistor according to a falling edge of the input signal. The second turn-on path turns on the second characteristic transistor according to the rising edge. The second turn-off path turns off the second characteristic transistor according to the falling edge. The first turn-on path and the second turn-on path produce a first delay time to delay turning on the first characteristic transistor, and the first turn-off path and the second turn-off path produce a second delay time to delay turning off the second characteristic transistor.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawings as follows:

FIG. 2B is a schematic waveform of turning-off the IGBT and the MOSFET of the hybrid drive circuit according to the present disclosure.

DETAILED DESCRIPTION OF THE INVENTION

Figure 1:
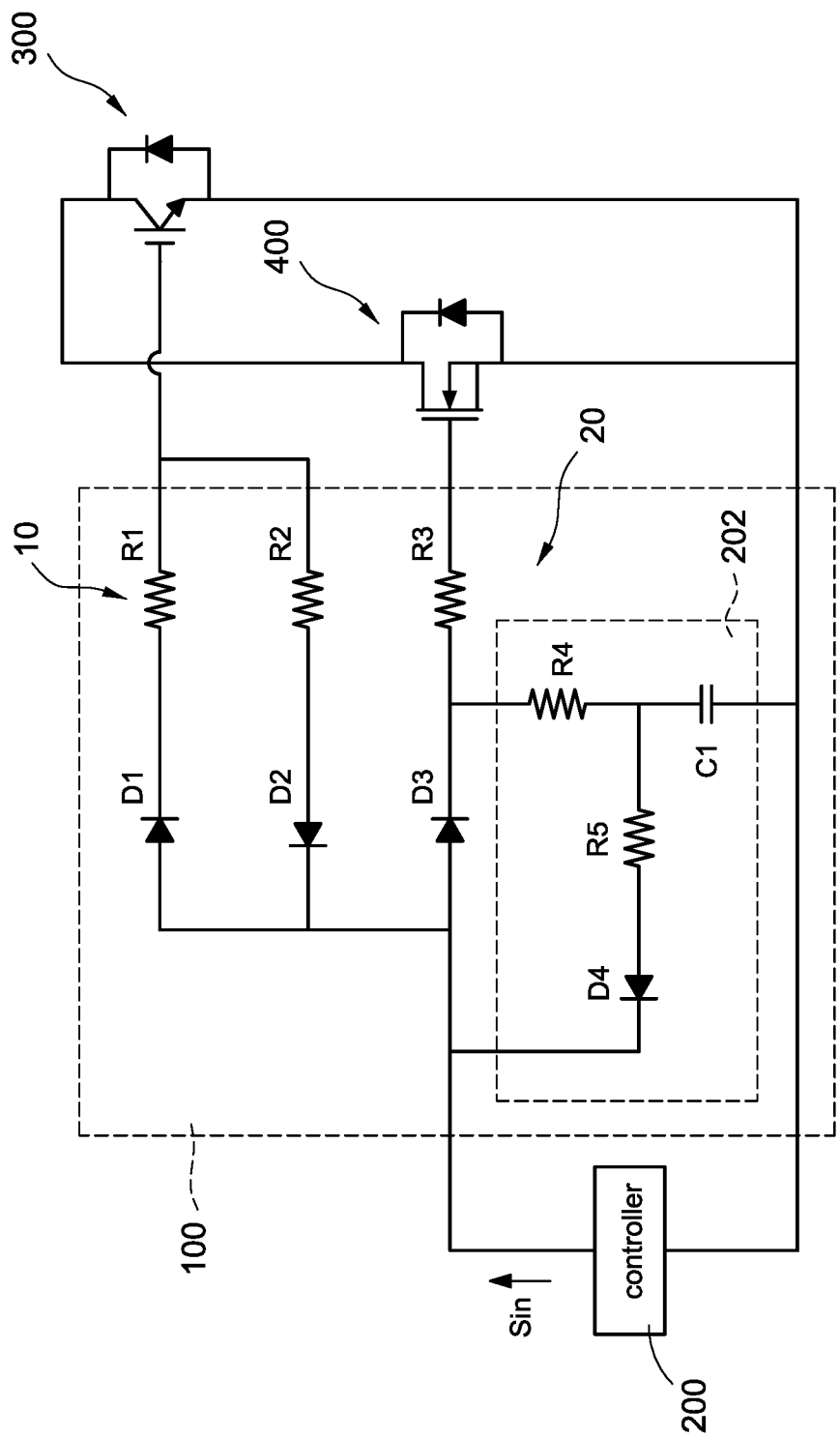
FIG. 1 is a circuit block diagram of a hybrid drive circuit according to a first embodiment of the present disclosure.

Reference will now be made to the drawing figures to describe the present disclosure in detail. It will be understood that the drawing figures and exemplified embodiments of present disclosure are not limited to the details thereof.

Please refer to FIG. 1, which shows a circuit block diagram of a hybrid drive circuit according to a first embodiment of the present disclosure. The hybrid drive circuit 100 receives an input signal Sin from a controller 200, and drive a first characteristic transistor and a second characteristic transistor coupled to the first characteristic transistor in parallel according to the input signal Sin. For convenience, take an insulated gate bipolar transistor (IGBT) 300 as the first characteristic transistor and a metal-oxide-semiconductor field-effect transistor (MOSFET) 400 as the second characteristic transistor for example, but not limited to those. For example, the second characteristic transistor may be power semiconductor components with different characteristics, such as a SiC MOSFET or a Gallium Nitride (GaN). The hybrid drive circuit 100 includes a first branch 10 and a second branch 20. The first branch 10 is coupled to the IGBT 300 and the second branch 20 is coupled to the MOSFET 400. The first branch 10 includes a first diode D1 and a first resistor R1 coupled to the first diode D1 in series, and a second diode D2 and a second resistor R2 coupled to the second diode D2 in series. An anode of the first diode D1 and a cathode of the second diode D2 are coupled to the input signal Sin, and the first resistor R1 and the second resistor R2 are coupled to the IGBT 300. A direction of the first diode D1 is different from that of the second diode D2, in which, the direction here indicates the direction of flowing in the transistor or flowing out from the transistor.

The second branch 20 includes a third diode D3 and a third resistor R3 coupled to the third diode D3 in series and a discharge circuit 202. The discharge circuit 202 is coupled to the third diode D3, the third resistor R3, and the input signal Sin, and further includes a fourth resistor R4, a first capacitor C1, a fifth resistor R5, and a fourth diode D4. One end of the fourth resistor R4 is coupled between the third diode D3 and the third resistor R3, and the other end of the fourth resistor R4 is coupled to one end of the first capacitor C1, and the other end of the first capacitor C1 is coupled to a ground point. One end of the fifth resistor R5 is coupled between the fourth resistor R4 and the first capacitor C1, and the other end of the fifth resistor R5 is coupled to an anode of the fourth diode D4. An anode of the third diode D3 and a cathode of the fourth diode D4 are coupled to the input signal Sin, and the first resistor R3 is coupled to the MOSFET 400. Similarly, a direction of the third diode D3 is different from that of the fourth diode D4.

Specifically, a first turn-on path is composed of the first diode D1 and the first resistor R1, and the first turn-on path turns on the IGBT 300 according to a rising edge of the input signal Sin. A first turn-off path is composed of the second diode D2 and the second resistor R2, and the first turn-off path turns off the IGBT 300 according to a falling edge of the the input signal Sin. A second turn-on path is composed of the third diode D3 and the third resistor R3, and the second turn-on path turns on the MOSFET 400 according to the rising edge of the input signal Sin. A second turn-off path is composed of the third resistor R3, the fourth resistor R4, the fifth resistor R5, and the fourth diode D4, and the second turn-off path turns off the MOSFET 400 according to the falling edge of the input signal Sin.

Figure 2A:
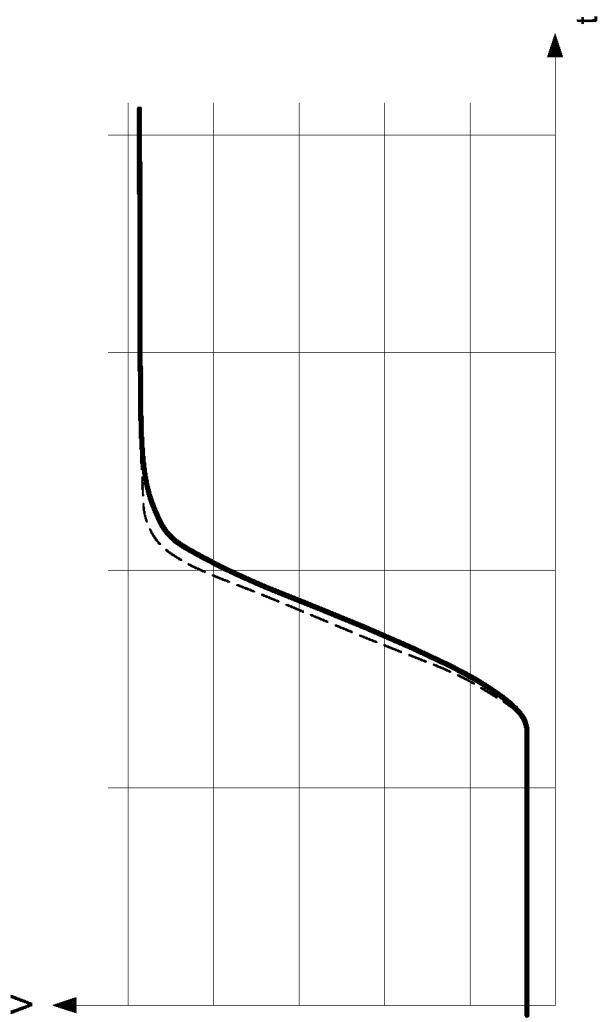
FIG. 2A is a schematic waveform of turning-on an IGBT and a MOSFET of the hybrid drive circuit according to the present disclosure.

Please refer to FIG. 2A and FIG. 2B, which show schematic waveforms of turning-on and turning off an IGBT and a MOSFET of the hybrid drive circuit according to the present disclosure, respectively, and also refer to FIG. 1. Since the conduction loss of the IGBT 300 is lower than that of the MOSFET 400 but the switching loss of the IGBT 300 is higher than that of the MOSFET 400, turning on the MOSFET 400 is faster than turning on the IGBT 300 in the rising edge of the input signal Sin, thereby effectively reducing the switching loss. On the contrary, turning off the MOSFET 400 is slower than turning off the IGBT 300 in the falling edge of the input signal Sin, thereby effectively reducing the switching losses. For convenience, in one embodiment of the present disclosure, the waveform of the MOSFET 400 is indicated by a broken line, and the waveform of the IGBT 300 is indicated by a solid line.

Specifically, the main purpose of the hybrid drive circuit 100 is how to effectively turn on the MOSFET 400 early and turn off the MOSFET 400 late so that the current flows through only the MOSFET 400 with low switching loss when the MOSFET 400 is turned on but the IGBT 300 has not been turned on (as shown in FIG. 2A), thereby effectively reducing the switching losses. In particular, as shown in FIG. 2B, the operation of first turning off the IGBT 300 is similar, and the detail description is omitted here for conciseness. As shown in FIG. 2A and FIG. 2B, when the MOSFET 400 and the IGBT 300 are turned on, most of the current flows through the IGBT 300 and only a small portion of the current flows through the MOSFET 400 since the on-resistance of the IGBT 300 is lower, thereby effectively reducing the conduction losses. Therefore, the hybrid drive circuit 100 needs to control the turn-on time and the turn-off time of the IGBT 300 and the MOSFET 400.

Figure 3A:
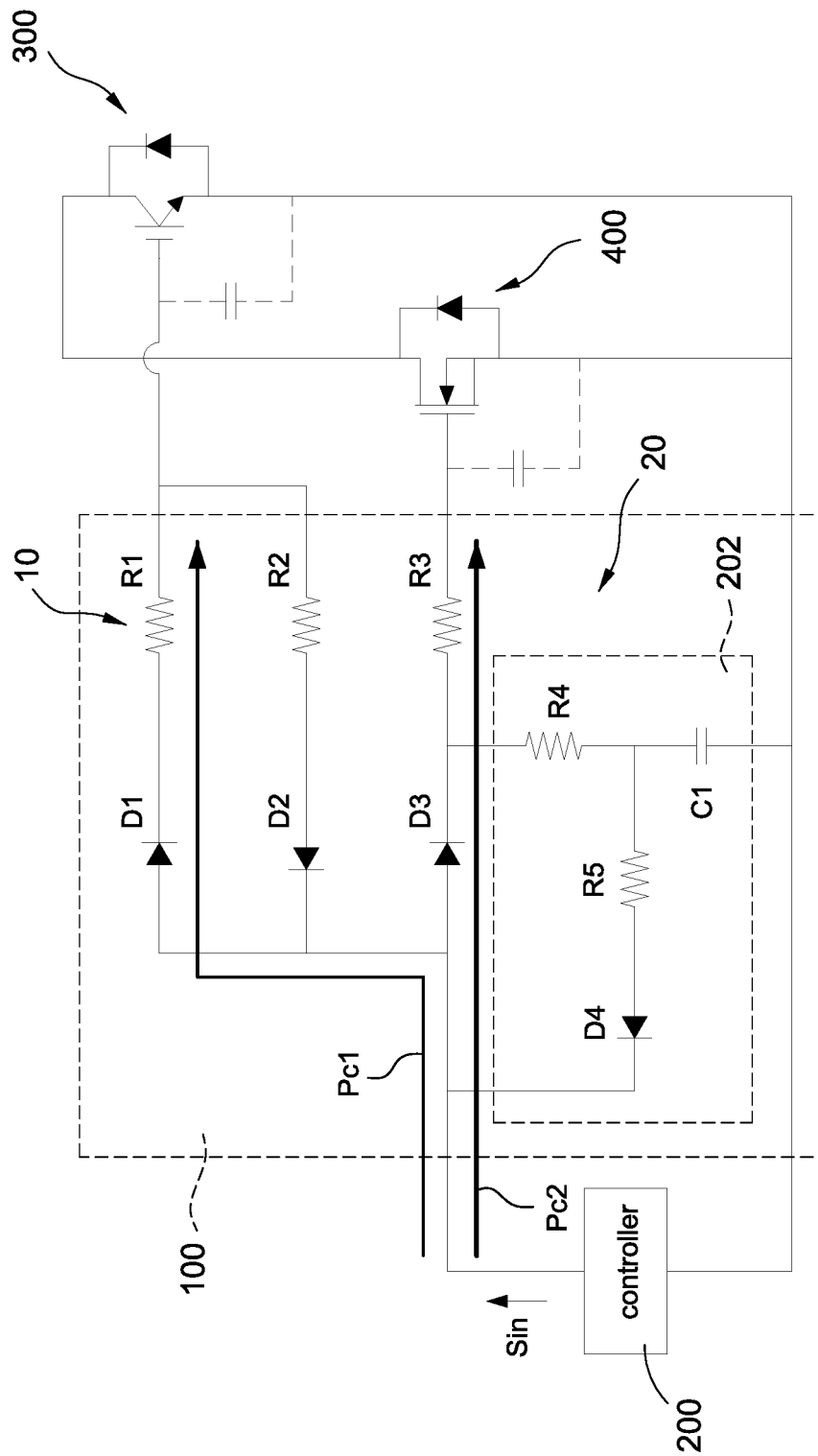
FIG. 3A is a schematic current diagram of turning-on the IGBT and the MOSFET of the hybrid drive circuit according to the present disclosure.

Please refer to FIG. 3A, which shows a schematic current diagram of turning-on the IGBT and the MOSFET of the hybrid drive circuit according to the present disclosure, and also refer to FIG. 1 to FIG. 2B. A first turn-on path Pc1 of the hybrid drive circuit 100 turns on the IGBT 300, and a second turn-on path Pc2 thereof turns on the MOSFET 400. Since the time of turning on the MOSFET 400 must be faster than that of turning on the IGBT 300, the resistance of the first resistor R1 must be greater than that of the third resistor R3. For example but not limited to that the first resistor R1 is 70 ohms and the third resistor R3 is 40 ohms. Therefore, a time constant of the RC circuit composed of the first resistor R1 and the parasitic capacitance of the IGBT 300 is larger and the charge time is longer than those of the RC circuit composed of the third resistor R3 and the parasitic capacitance of the MOSFET 400. Since the difference in the charge time, a first delay time is generated between turning on the IGBT 300 by the first turn-on path Pc1 and turning on the MOSFET 400 by the second turn-on path Pc2, thereby providing the turn-on sequence shown in FIG. 2A. In particular, besides adjusting the resistance of the first resistor R1 or that of the third resistor R3, adjusting the parasitic capacitance by selecting the IGBT 300 or the MOSFET 400 is related to the charge time.

Figure 3B:
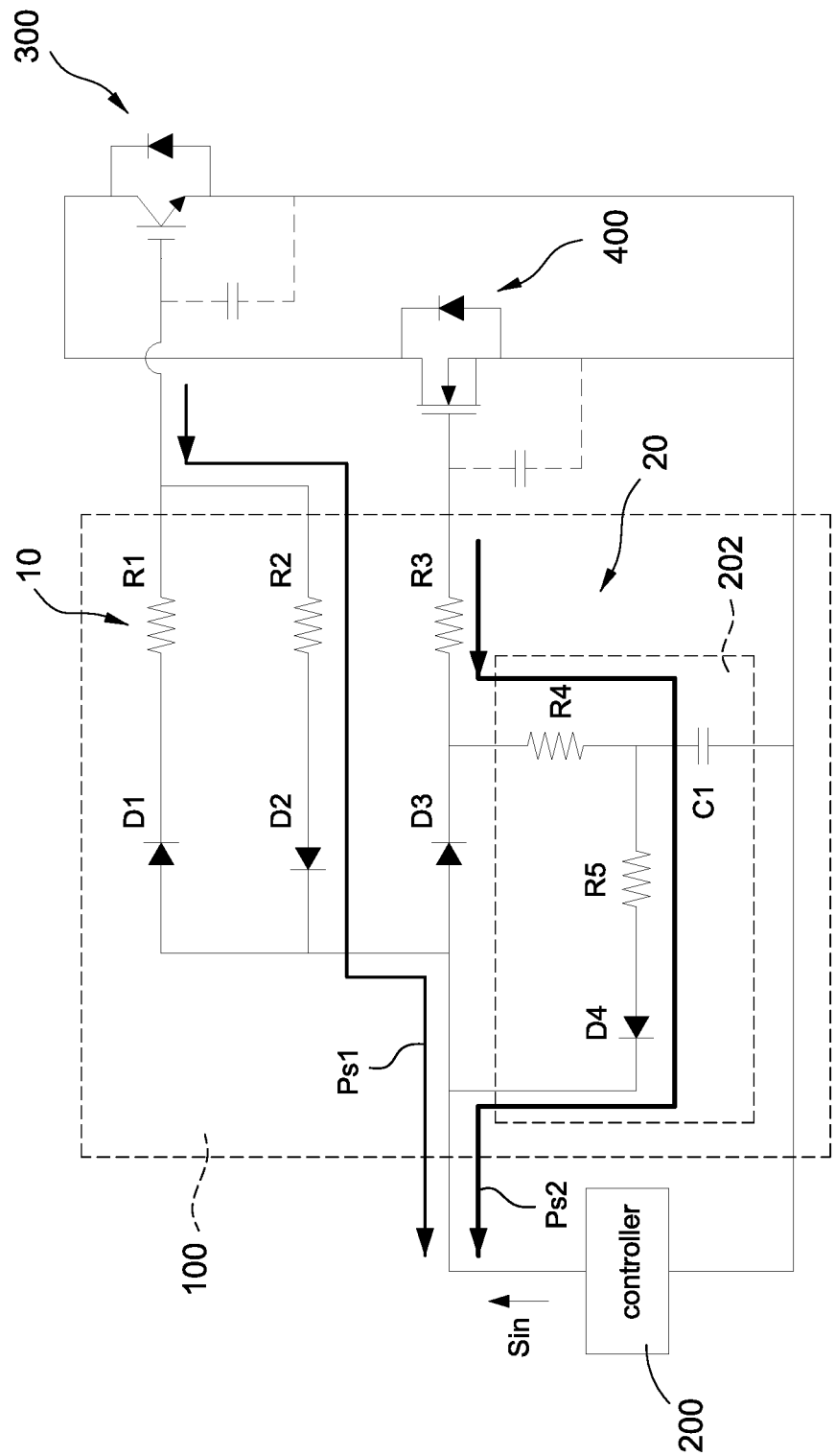
FIG. 3B is a schematic current diagram of turning-off the IGBT and the MOSFET of the hybrid drive circuit according to the present disclosure.

Please refer to FIG. 3B, which shows a schematic current diagram of turning-off the IGBT and the MOSFET of the hybrid drive circuit according to the present disclosure, and also refer to FIG. 1 to FIG. 2B. A first turn-off path Ps1 of the hybrid drive circuit 100 turns off the IGBT 300, and a second turn-off path Ps2 thereof turns off the MOSFET 400. Since the time of turning off the MOSFET 400 must be slower than that of turning off the IGBT 300, the sum resistance of the third resistor R3, the fourth resistor R4, and the fifth resistor R5 must be greater than that of the second resistor R2. For example but not limited to that the third resistor R3 is 40 ohms, the fourth resistor R4 is 40 ohms, the fifth resistor R5 is 50 ohms, and the second resistor R2 is 50 ohms. Therefore, only the second resistor R2 with a small resistance discharges and the discharge time is short when the IGBT 300 is turned off. Since the RC circuit composed of the third resistor R3, the fourth resistor R4, the fifth resistor R5, and the first capacitor C1 has a larger time constant, the discharge time thereof is longer comparing to the time constant of the second resistor R2 and the IGBT 300. Since the difference in the discharge time, a second delay time is generated between turning off the IGBT 300 by the first turn-off path Ps1 and turning off the MOSFET 400 by the second turn-off path Ps2, thereby providing the turn-off sequence shown in FIG. 2B. In particular, besides adjusting the resistance of the second resistor R2, that of the third resistor R3, that of the fourth resistor R4, or that of the fifth resistor R5, adjusting the parasitic capacitance by selecting the IGBT 300 or the MOSFET 400 or the capacitance of the first capacitor C1 is related to the discharge time.

Figure 4:
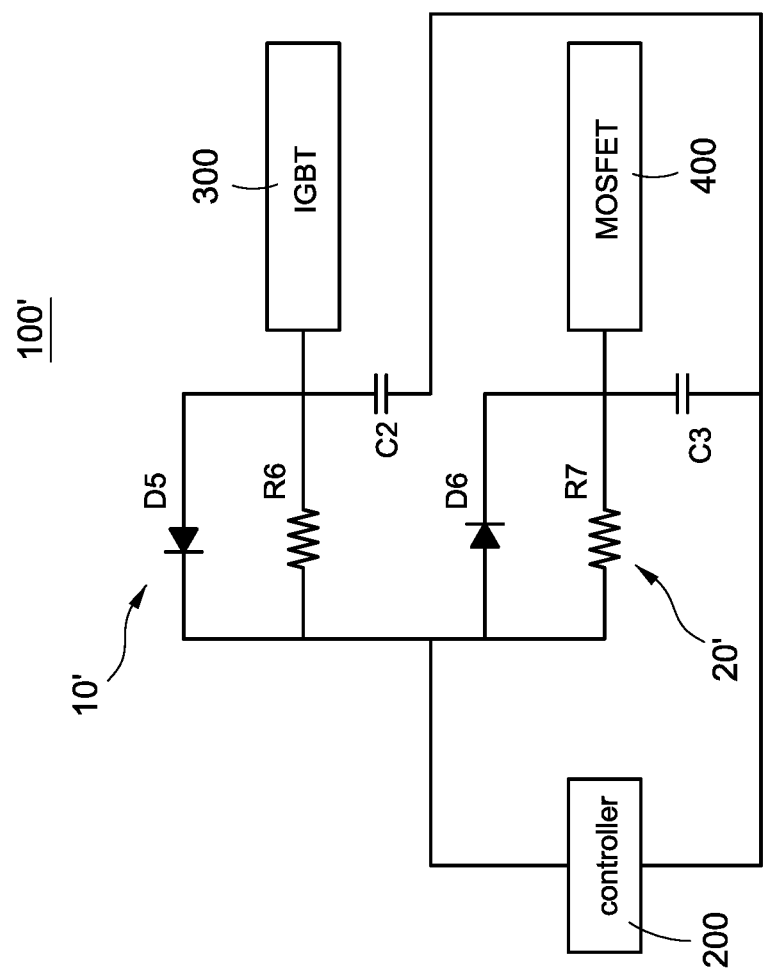
FIG. 4 is a circuit block diagram of the hybrid drive circuit according to a second embodiment of the present disclosure.

Please refer to FIG. 4, which shows a circuit block diagram of the hybrid drive circuit according to a second embodiment of the present disclosure, and also refer to FIG. 1 to FIG. 3B. The hybrid drive circuit 100' includes a first branch 10' and a second branch 20'. The first branch 10' is coupled to the IGBT 300 and the second branch 20' is coupled to the MOSFET 400. The first branch 10' includes a fifth diode D5, a sixth resistor R6, and a second capacitor C2. A cathode of the fifth diode D5 is coupled to the input signal Sin and an anode of the fifth diode D5 is coupled to the IGBT 300. The sixth resistor R6 is coupled to the fifth diode D5 coupled to the sixth resistor R6 in parallel. One end of the second capacitor C2 is coupled to the fifth diode D5, the sixth resistor R6, and the IGBT 300; the other end of the second capacitor C2 is coupled to a ground point. The second branch 20' includes a sixth diode D6, a seventh resistor R7, and a third capacitor C3. An anode of the sixth diode D6 is coupled to the input signal Sin, and a cathode of the sixth diode D6 is coupled to the MOSFET 400. A direction of the fifth diode D5 is different from that of the sixth diode D6. The seventh resistor R7 is coupled to the sixth diode D6. One end of the third capacitor C3 is coupled to the sixth diode D6, the seventh resistor R7, and the MOSFET 400, and the other end of the third capacitor C3 is coupled to the ground point.

Specifically, the sixth resistor R6 is a first turn-on path and the fifth diode D5 is a first turn-off path. The sixth diode D6 is a second turn-on path and the seventh resistor R7 is a second turn-off path. When the IGBT 300 and the MOSFET 400 are turned on, an RC circuit is composed of the sixth resistor R6 and the second capacitor C2, and the rising edge of the input signal Sin directly charges the third capacitor C3. Therefore, a charge time provided by the RC circuit (composed of the sixth resistor R6 and the second capacitor C2) is longer than a charge time provided by the third capacitor C3. Since the difference in the charge time, a first delay time is generated between turning on the IGBT 300 by the first turn-on path Pc1 and turning on the MOSFET 400 by the second turn-on path Pc2, thereby providing the turn-on sequence shown in FIG. 2A. In particular, besides adjusting the resistance, adjusting the capacitance is related to the charge time.

When the IGBT 300 and the MOSFET 400 are turned off, an RC circuit is composed of the seventh resistor R7 and the third capacitor C3, and the second capacitor C2 directly discharges. Therefore, a discharge time provided by the RC circuit (composed by the seventh resistor R7 and the third capacitor C3) is longer than a discharge time provided by the second capacitor C2. Since the difference in the discharge time, a second delay time is generated between turning off the IGBT 300 by the first turn-off path Ps1 and turning off the MOSFET 400 by the second turn-off path Ps2, thereby providing the turn-off sequence shown in FIG. 2B. In particular, besides adjusting the resistance, adjusting the capacitance is related to the discharge time.

Figure 5A:
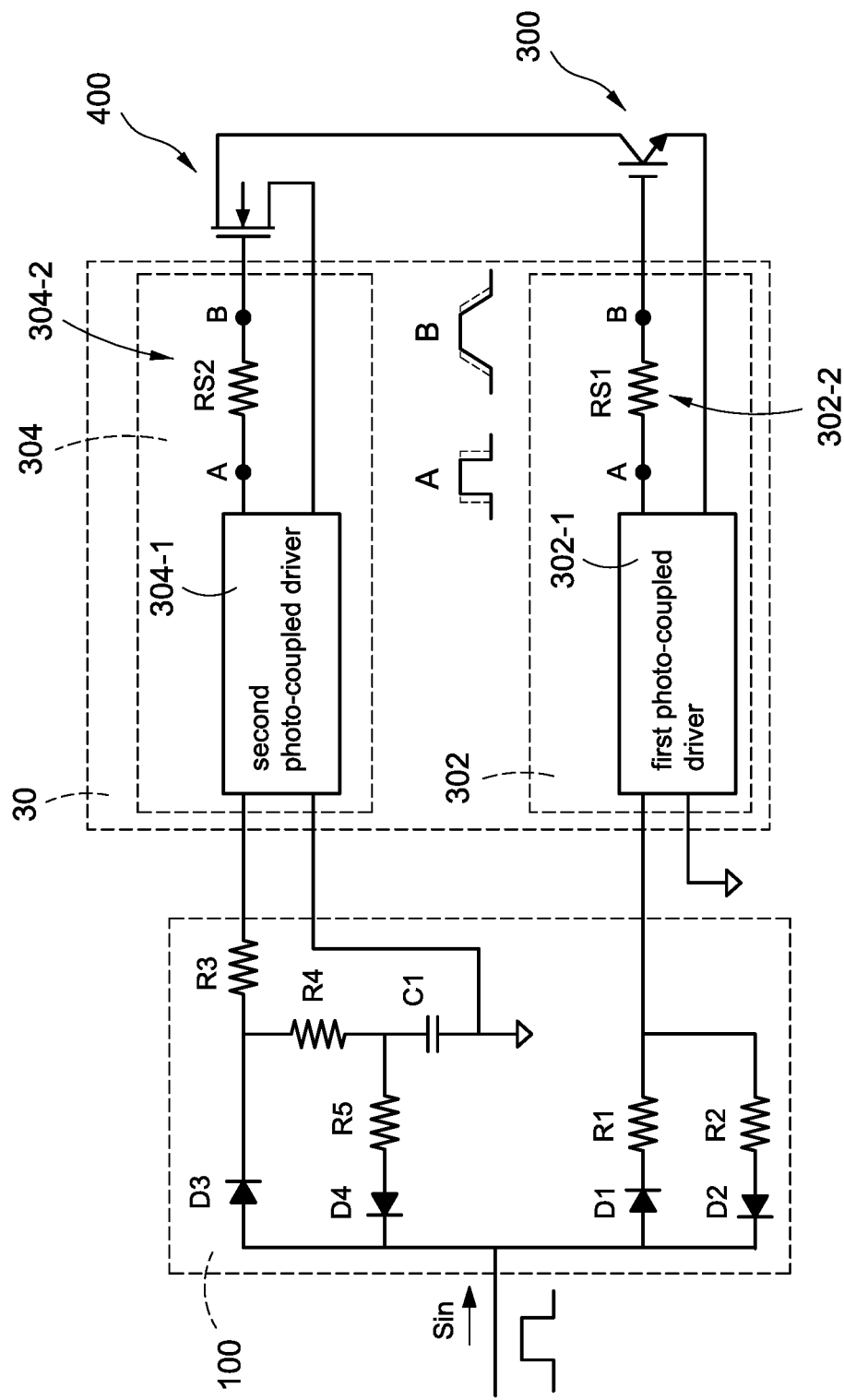
FIG. 5A is a circuit block diagram of the hybrid drive circuit having a photo-coupled drive module according to a third embodiment of the present disclosure.

Please refer to FIG. 5A, which shows a circuit block diagram of the hybrid drive circuit having a photo-coupled drive module according to a third embodiment of the present disclosure, and also refer to FIG. 1 to FIG. 4. An isolated component is used for the isolation of the drive circuit, and the isolated component may be a photo-coupled component, a capacitive-coupled component, or a magnetic-coupled component. For convenience, take the photo-coupled component for example. The hybrid drive circuit 100 includes a photo-coupled drive module 30. The photo-coupled drive module 30 is coupled between a first branch 10, a second branch 20, and an IGBT 300, a MOSFET 400. The photo-coupled drive module 30 includes a first photo-coupled drive circuit 302 and a second photo-coupled drive circuit 304. The first photo-coupled drive circuit 302 includes a first photo-coupled driver 302-1 and a first slope adjust circuit 302-2. The first photo-coupled driver 302-1 is coupled to the first branch 10, and the first slope adjust circuit 302-2 is coupled to the first photo-coupled driver 302-1 and the IGBT 300. The second photo-coupled drive circuit 304 includes second photo-coupled driver 304-1 and a second slope adjust circuit 304-2. The second photo-coupled driver 304-1 is coupled to the second branch 20, and the second slope adjust circuit 304-2 is coupled to the second photo-coupled driver 304-1 and the MOSFET 400.

Specifically, the first photo-coupled drive circuit 302 provides a first drive signal to the IGBT 300 according to a signal provided by the first branch 10, and the second photo-coupled drive circuit 304 provides a second drive signal to the MOSFET 400 according to a signal provided by the second branch 20. Since the first photo-coupled driver 302-1 and the second photo-coupled driver 304-1 have the characteristics of producing a high-level signal when the rising edge rises to reach a trigger point and producing a low-level signal when the falling edge falls to reach a trigger point, a first drive signal or a second drive signal acquired at an A point becomes a waveform (I) close to a square wave when a waveform having a slope passes through the first photo-coupled driver 302-1 and the second photo-coupled driver 304-1 shown in FIG. 2A and FIG. 2B so that the delay time of the IGBT 300 and the MOSFET 400 can be controlled without causing excessive losses due to the longer turn-on and turn-off time. However, the waveform (I) is close to the square wave with sharp rising edge and sharp falling edge, thus generating higher electromagnetic interference (EMI). Therefore, the first slope adjust circuit 302-2 and the second slope adjust circuit 304-2 are used to adjust the slope of the rising edge and that of the falling edge of the waveform (I) so that the first drive signal or the second drive signal acquired at a B point becomes a waveform (II) close to a trapezoidal wave. As shown in FIG. 5A, the first slope adjust circuit 302-2 and the second slope adjust circuit 304-2 are slope adjust resistors RS1, RS2, and the waveform (I) with sharp rising edge and sharp falling edge is adjusted to the waveform (II) with slow rising edge and slow falling edge.

Figure 5B:
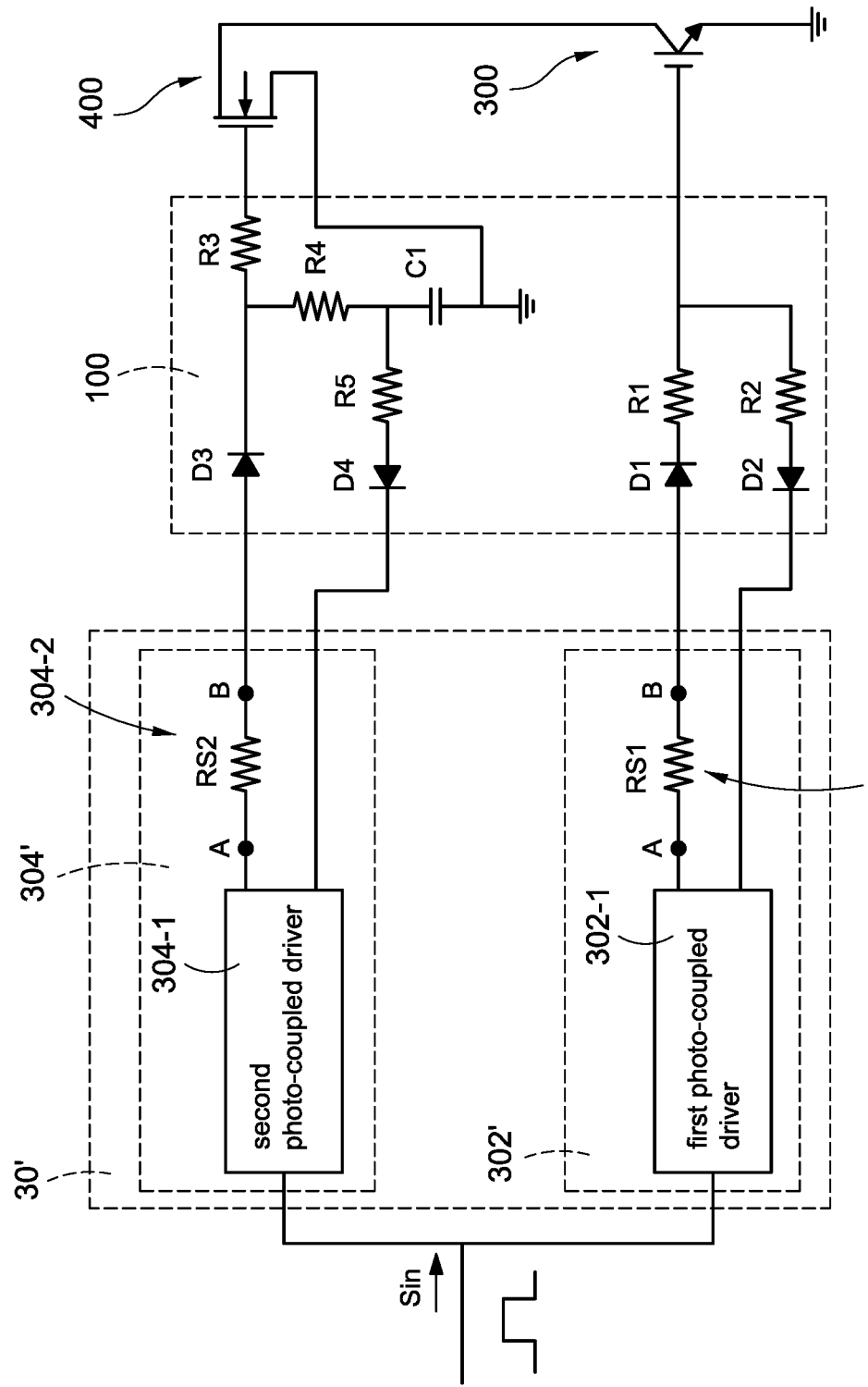
FIG. 5B is a circuit block diagram of the hybrid drive circuit having the photo-coupled drive module according to a fourth embodiment of the present disclosure.

Please refer to FIG. 5B, which shows a circuit block diagram of the hybrid drive circuit having the photo-coupled drive module according to a fourth embodiment of the present disclosure, and also refer to FIG. 1 to FIG. 5A. The difference between the fourth embodiment and the third embodiment shown in FIG. 5A is that the photo-coupled drive module 30' in the former is coupled an input signal Sin, a first branch 10, and a second branch 20. After the input signal Sin passes through the first photo-coupled driver 302-1 and the second photo-coupled driver 304-1, a signal acquired at the A point is basically identical since the input signal Sin is identical, and therefore the delay effect is implemented when the signal acquired at the A point passes through the first branch 10 and the second branch 20. Specifically, the difference in the position of the photo-coupled drive module 30 of FIG. 5A and that of 5B: since the time of switching procedure by the first photo-coupled driver 302-1 and the second photo-coupled driver 304-1 is faster, the delay time is generated and the turn-on and turn-off are not extended when the photo-coupled drive module 30 is disposed at the position of FIG. 5A, thereby reducing unnecessary losses. Therefore, the photo-coupled drive module 30 is preferably disposed at the position of FIG. 5A, which can reduce the losses of the overall circuit.

Figure 6:
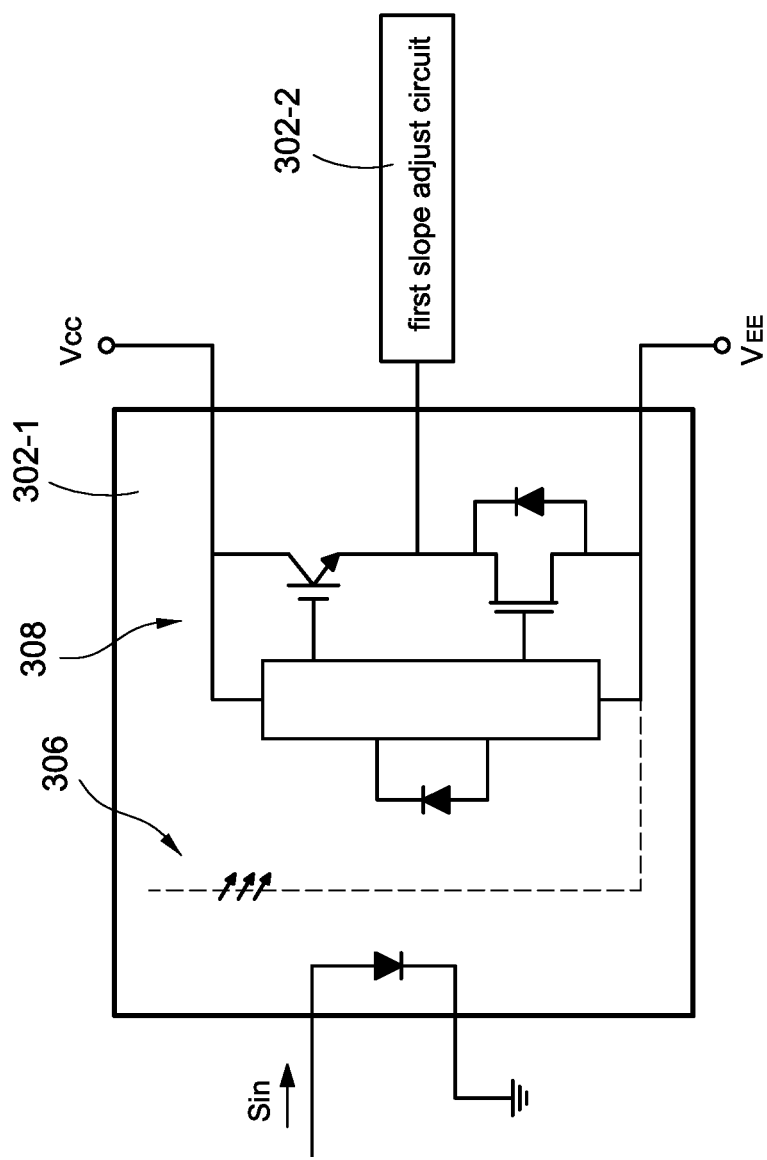
FIG. 6 is a circuit block diagram of the photo-coupled drive module according to the present disclosure.

Please refer to FIG. 6, which shows a circuit block diagram of the photo-coupled drive module according to the present disclosure, and also refer to FIG. 1 to FIG. 5B. The first photo-coupled driver 302-1 and the second photo-coupled driver 304-1 includes a photo-coupled unit 306 and a drive unit 308, respectively. Take the circuit structure and connection relationship shown in FIG. 5A for example, the photo-coupled unit 306 provides a high-level signal according to a rising edge rising (increasing) to a first trigger point, and provides a low-level signal according to a falling edge falling (decreasing) to a second trigger point. Specifically, since the photo-coupled unit 306 has the characteristic of fast switching, the photo-coupled unit 306 quickly switches to be turned on when a voltage value of the rising edge gradually increases to a voltage value of the trigger point (the falling edge is also the same). Therefore, the photo-coupled unit 306 can adjust the rising or falling waveform to a sharp rising or sharp falling waveform. Since the photo-coupled unit 306 switches to be turned on or turned off when the rising edge or the falling edge reaches the trigger point, thereby causing a slight delay of the input waveform and the output waveform by the photo-coupled unit 306.

In particular, the VCC is a drive voltage and the VEE is a reference ground voltage. Since the high-level signal provided by the photo-coupled unit 306 is not enough as the drive voltage VCC to drive the IGBT 300 or the MOSFET 400, the drive unit 308 needs to be used to provide the drive voltage VCC to drive the IGBT 300 or the MOSFET 400. When the signal provided by the photo-coupled unit 306 is high-level, the drive unit 308 provides the drive voltage VCC according to the high-level signal to turn on the IGBT 300 or the MOSFET 400. When the signal provided by the photo-coupled unit 306 is low-level, the drive unit 308 does not provide the drive voltage VCC according to the low-level signal to turn off the IGBT 300 or the MOSFET 400. In one embodiment of the present disclosure, the first photo-coupled driver 302-1 and the second photo-coupled driver 304-1 are, for example but not limited to, the photo-coupled driver (HCPL-3120) manufactured by Hewlett-Packard Company. In other words, both the first photo-coupled driver 302-1 and the second photo-coupled driver 304-1 can be replaced with a photo-coupled driver or other isolated drivers having the same effect.

Figure 7:
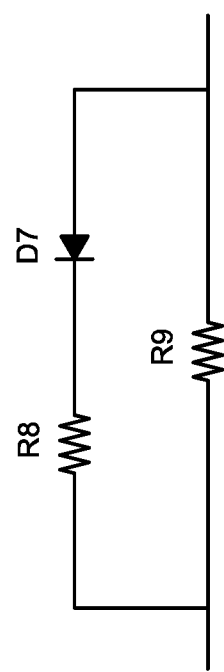
FIG. 7 is a circuit diagram of a slope adjust circuit according to the present disclosure.

Please refer to FIG. 7, which shows a circuit diagram of a slope adjust circuit according to the present disclosure, and also refer to FIG. 1 to FIG. 6. The first slope adjust circuit 302-2 and the second slope adjust circuit 304-2 shown in FIG. 5A are slope adjust resistors RS1, RS2, respectively, and the slop adjust resistors RS1, RS2 can simultaneously adjust slopes of the rising edge and the falling edge of the waveform (I). Although the circuit structure is relatively simple, it is not possible to separately and independently adjust the slope of the rising edge and the slope of the falling edge. In comparison with FIG. 5A, the first slope adjust circuit 302-2' and the second slope adjust circuit 304-2' shown in FIG. 7 can separately and independently adjust the slope of the rising edge and the slope of the falling edge. Specifically, the first slope adjust circuit 302-2' or the second slope adjust circuit 304-2' includes an eighth resistor R8, a seventh diode D7, and a ninth resistor R9. A cathode of the seventh diode D7 is coupled to the eighth resistor R8 in series, the ninth resistor R9 is coupled to the in-series eighth resistor R8 and the seventh diode D7 in parallel, and the ninth resistor R9 is coupled to an anode of the seventh diode D7. The first drive signal or the second drive signal passes through a rising-edge path composed by the ninth resistor R9, and the first drive signal or the second drive signal passes through a falling-edge path composed by the eighth resistor R8 and the seventh diode D7. When the first drive signal or the second drive signal passes through the rising-edge path, the ninth resistor R9 adjusts the slope of the first rising edge or that slope of the second rising edge; when the first drive signal or the second drive signal passes through the falling-edge path, the eighth resistor R8 adjusts the slope of the first falling edge or the slope of the second falling edge.

Further, since the ninth resistor R9 and the eighth resistor R8 can separately and independently adjust the slope of the rising edge and the slope of the falling edge, the designer can choose the appropriate slope of the rising edge and that of the falling edge according to the considerations of switching losses and electromagnetic interference. In other words, the resistance values of the ninth resistor R9 and the eighth resistor R8 may be different depending on the optimum design.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A hybrid drive circuit (100, 100') configured to drive a first characteristic transistor and a second characteristic transistor coupled in parallel to the first characteristic transistor according to an input signal (Sin), characterized in that the hybrid drive circuit (100, 100') comprising:
   a first branch (10, 10') comprising:
      a first turn-on path (Pc1) configured to turn on the first characteristic transistor according to a rising edge of the input signal (Sin), and
      a first turn-off path (Ps1) configured to turn off the first characteristic transistor according to a falling edge of the input signal (Sin), and
   a second branch (20, 20') comprising:
      a second turn-on path (Pc2) configured to turn on the second characteristic transistor according to the rising edge of the input signal (Sin), and
      a second turn-off path (Ps2) configured to turn off the second characteristic transistor according to the falling edge of the input signal (Sin),
   wherein the first branch (10, 10') comprises a first diode (D1) and a first resistor (R1) coupled to the first diode (D1) in series, and a second diode (D2) and a second resistor (R2) coupled to the second diode (D2) in series; a direction of the first diode (D1) is different from a direction of the second diode (D2); the first turn-on path (Pc1) is composed of the first diode (D1) and the first resistor (R1), and the first turn-off path (Ps1) is composed of the second diode (D2) and the second resistor (R2);
   wherein the second branch (20, 20') comprises a third diode (D3) and a third resistor (R3) coupled to the third diode (D3) in series, and a discharge circuit (202); wherein the discharge circuit (202) comprises a fourth resistor (R4), a first capacitor (C1), a fifth resistor (R5), and a fourth diode (D4); the fourth resistor (R4) is coupled to the third diode (D3) and the third resistor (R3), and the first capacitor (C1) is coupled to the fourth resistor (R4); the fifth resistor (R5) is coupled to the fourth resistor (R4) and the first capacitor (C1), and the fourth diode (D4) is coupled to the fifth resistor (R5); a direction of the third diode (D3) is different from a direction of the fourth diode (D4); the second turn-on path (Pc2) is composed of the third diode (D3) and the third resistor (R3), and the second turn-off path (Ps2) is composed of the third resistor (R3), the fourth resistor (R4), the fifth resistor (R5), and the fourth diode (D4);
   wherein the first turn-on path (Pc1) and the second turn-on path (Pc2) are configured to produce a first delay time to delay turning on the first characteristic transistor, and the first turn-off path (Ps1) and the second turn-off path (Ps2) are configured to produce a second delay time to delay turning off the second characteristic transistor.

2. The hybrid drive circuit (100, 100') in claim 1, wherein a resistance of the first resistor (R1) is greater than a resistance of the third resistor (R3) so that a charge time provided by the first resistor (R1) is longer than a charge time provided by the third resistor (R3) to produce the first delay time.

3. The hybrid drive circuit (100, 100') in claim 1, wherein a sum of a resistance of the third resistor (R3), a resistance of the fourth resistor (R4), and a resistance of the fifth resistor (R5) is greater than a resistance of the second resistor (R2) so that a discharge time provided by the third resistor (R3), the fourth resistor (R4), the fifth resistor (R5), and the first capacitor (C1) is longer than a discharge time provided by the second resistor (R2) to produce the second delay time.

4. The hybrid drive circuit (100, 100') in claim 1, wherein the first characteristic transistor is an insulated gate bipolar transistor and the second characteristic transistor is a metal-oxide-semiconductor field-effect transistor.

* * * * *